US012575078B2

(12) United States Patent
Im

(10) Patent No.: US 12,575,078 B2
(45) Date of Patent: Mar. 10, 2026

(54) THREE-DIMENSIONAL MEMORY ARRAY COMPRISING STACKED OXIDE SEMICONDUCTORS IN HYBRID CHANNEL

(71) Applicant: SK hynix Inc., Gyeonggi-do (KR)

(72) Inventor: Mir Im, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 559 days.

(21) Appl. No.: 17/677,585

(22) Filed: Feb. 22, 2022

(65) Prior Publication Data

US 2023/0035006 A1 Feb. 2, 2023

(30) Foreign Application Priority Data

Jul. 28, 2021 (KR) ........................ 10-2021-0099204

(51) Int. Cl.
H10B 12/00 (2023.01)
H10D 30/67 (2025.01)
H10D 99/00 (2025.01)

(52) U.S. Cl.
CPC ............. H10B 12/30 (2023.02); H10B 12/03 (2023.02); H10B 12/05 (2023.02); H10D 30/6748 (2025.01); H10D 30/6755 (2025.01); H10D 30/6757 (2025.01); H10D 99/00 (2025.01); H10B 12/00 (2023.02); H10D 30/6734 (2025.01)

(58) Field of Classification Search
CPC ............ H10B 12/30–488; H10B 12/05; H01L 29/7896–78693; H01L 29/78696; H01L 29/78687; H01L 29/78648; H10D 30/6734; H10D 30/6741; H10D 30/6755–6756

See application file for complete search history.

(56) References Cited

U.S. PATENT DOCUMENTS

| | | | | |
|---|---|---|---|---|
| 2015/0294710 | A1* | 10/2015 | Onuki | ................... H10D 86/60 365/149 |
| 2018/0061996 | A1* | 3/2018 | Oh | .................... H01L 29/78684 |
| 2019/0074277 | A1 | 3/2019 | Ramaswamy | |
| 2019/0296018 | A1 | 9/2019 | Cho et al. | |
| 2020/0083225 | A1* | 3/2020 | Ma | ........................ G11C 11/401 |
| 2020/0279601 | A1 | 9/2020 | Kim et al. | |
| 2022/0367721 | A1* | 11/2022 | Jeong | .................... H10B 12/05 |

OTHER PUBLICATIONS

Office Action for Korean Patent Application No. 10-2021-0099204 issued by the Korean Patent Office on Mar. 18, 2025.

* cited by examiner

*Primary Examiner* — Christine S. Kim
*Assistant Examiner* — Tyler J Wiegand
(74) *Attorney, Agent, or Firm* — IP & T GROUP LLP

(57) ABSTRACT

A semiconductor memory device comprises: a laterally oriented hybrid channel including outer channel materials and an inner channel material interposed between the outer channel materials; a laterally oriented double word line with the hybrid channel interposed therebetween; a vertically oriented bit line connected to a first end of the hybrid channel; and a capacitor connected to a second end of the hybrid channel.

20 Claims, 16 Drawing Sheets

FIG. 5A

THREE-DIMENSIONAL MEMORY ARRAY COMPRISING STACKED OXIDE SEMICONDUCTORS IN HYBRID CHANNEL

CROSS-REFERENCE TO RELATED APPLICATIONS

The present application claims priority to Korean Patent Application No. 10-2021-0099204, filed on Jul. 28, 2021, which is incorporated herein by reference in its entirety.

BACKGROUND

1. Field

The present invention relates to a semiconductor device and, more particularly, to a semiconductor memory device including a hybrid channel.

2. Description of the Related Art

The integration degree of two-dimensional semiconductor memory devices is mainly determined by the area occupied by the memory cells. Thus, the integration degree is mainly affected by the level of a fine-pattern fabrication technology. The integration degree of two-dimensional semiconductor memory devices is still increasing, but the increase is limited because fabricating finer patterns requires highly expensive tools. Accordingly, three-dimensional (3D) semiconductor memory devices having three-dimensionally arranged memory cells have been suggested.

SUMMARY

Various embodiments of the present invention provide highly integrated semiconductor memory devices.

A semiconductor memory device according to an embodiment of the present invention comprises: a laterally oriented hybrid channel including outer channel materials and an inner channel material interposed between the outer channel materials; a laterally oriented double word line with the hybrid channel interposed therebetween; a vertically oriented bit line connected to a first end of the hybrid channel; and a capacitor connected to a second end of the hybrid channel.

A semiconductor memory device according to an embodiment of the present invention comprises: a substrate; a plurality of hybrid channels stacked in a vertical direction to the substrate; a plurality of laterally oriented double word lines with each of the hybrid channels interposed between each of the double word lines; a vertically oriented bit line commonly connected to a first end of each of the hybrid channels; and capacitors respectively connected to second ends of the hybrid channels, wherein each of the hybrid channels includes high bandgap oxide semiconductor materials neighboring the laterally oriented double word lines; and a high mobility oxide semiconductor material disposed between the high bandgap oxide semiconductor materials.

A semiconductor memory device according to an embodiment of the present invention comprises: a substrate; and a three-dimensional array of memory cells over the substrate, wherein individual memory cells in the three-dimensional array include a transistor and a capacitor, wherein a channel of the transistor includes an inner oxide semiconductor material disposed between two outer oxide semiconductor materials.

The present invention may artificially confine a high concentration of electrons between an inner channel material and outer channel materials by stacking the inner and outer channel materials having different bandgaps. Accordingly, an on current (Ion) of transistor may be boosted by increasing the carrier mobility.

The present invention may improve a driving current and secure the stability of the threshold voltage by applying stacks of different oxide semiconductor materials as channels.

The present invention may apply a planar-shape capacitor by forming a hybrid channel using an oxide semiconductor material having low off leakage, thereby increasing the cell density.

BRIEF DESCRIPTION OF THE DRAWINGS

FIG. 5A is a schematic perspective view illustrating an array of memory cells according to an embodiment of the present invention.

DETAILED DESCRIPTION

Figure 1:
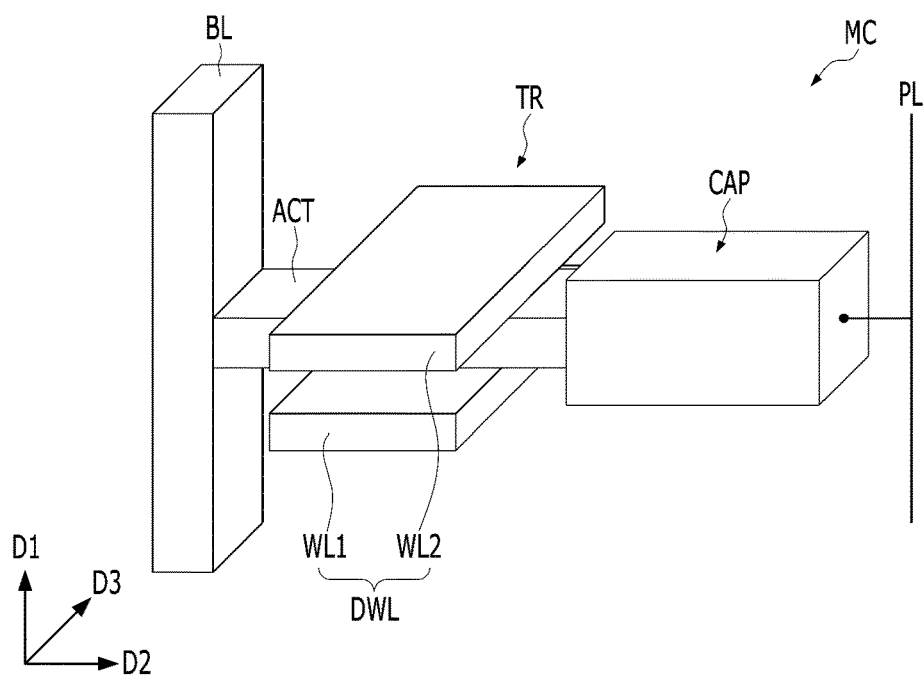
FIG. 1 is a schematic perspective view illustrating a memory cell of a semiconductor memory device.

Various embodiments described herein will be described with reference to cross-sectional views, plan views and block diagrams, which are schematic views of the present invention. Therefore, the structures of the drawings may be modified by fabricating technology and/or tolerances. Various embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention.

In an embodiment to be described later, memory cells are vertically stacked to increase memory cell density and reduce parasitic capacitance.

Figure 2:
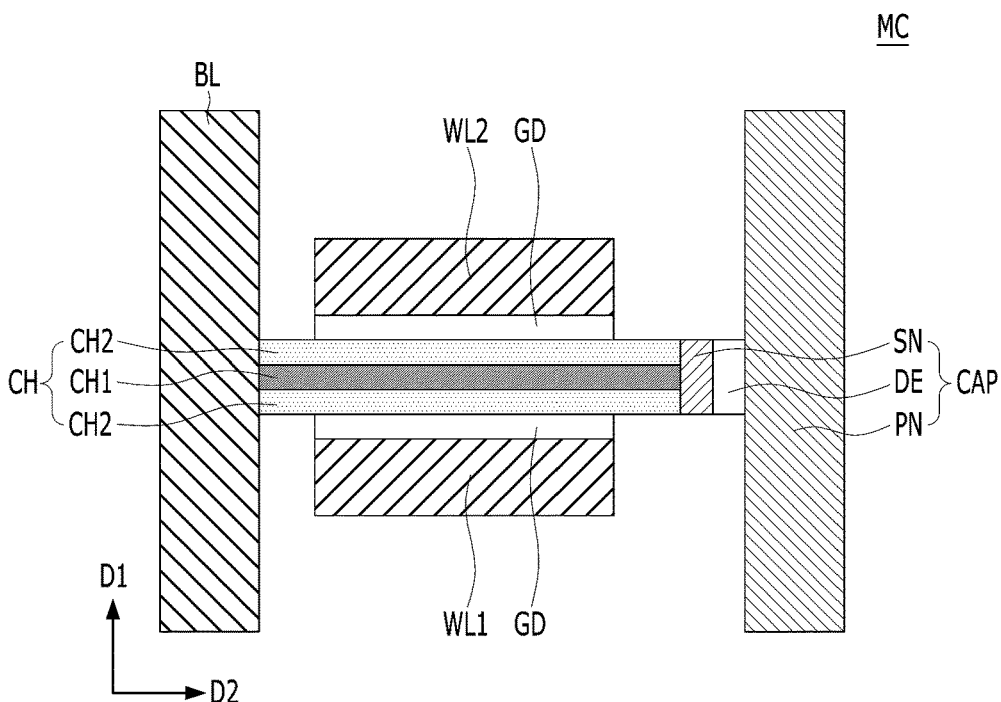
FIG. 2 is a schematic cross-sectional view of a memory cell MC of FIG. 1.
Figure 3:
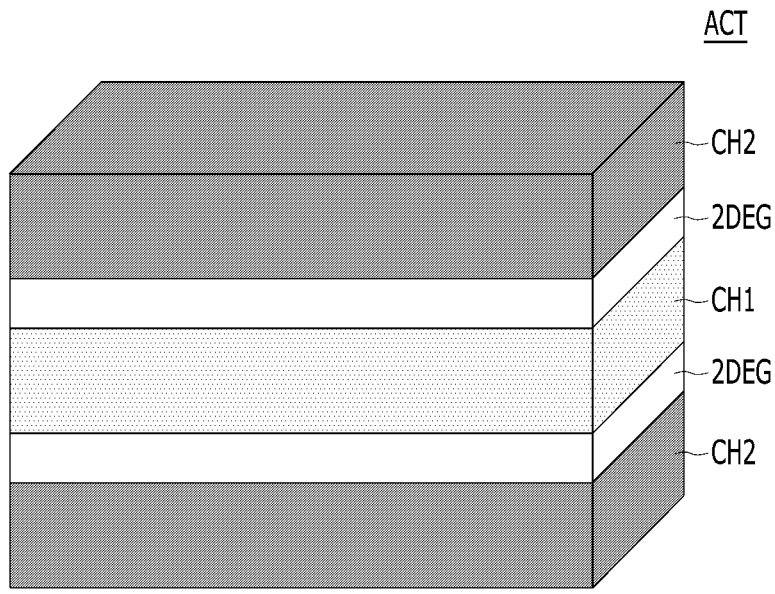
FIG. 3 is an enlarged view of a hybrid channel CH.
Figure 4:
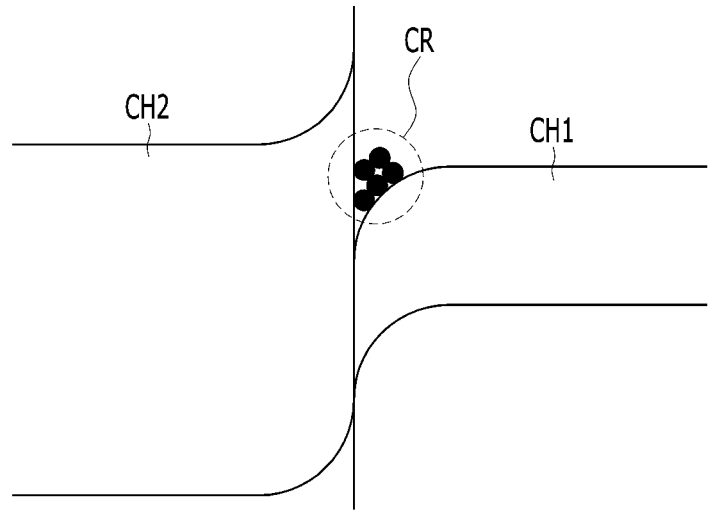
FIG. 4 is a band diagram of the hybrid channel of FIG. 3.

FIG. 1 is a schematic perspective view illustrating a memory cell of a semiconductor memory device according to an embodiment of the present invention. FIG. 2 is a schematic cross-sectional view of the memory cell MC of FIG. 1. FIG. 3 is an enlarged view of a hybrid channel CH. FIG. 4 is a band diagram of the hybrid channel of FIG. 3.

Referring to FIGS. 1, 2, 3, and 4, the memory cell MC may include a bit line BL, a transistor TR, and a capacitor CAP.

The transistor TR may include an active layer ACT, gate dielectric layers GD, and a double word line DWL. The capacitor CAP may include a storage node SN, a dielectric layer DE, and a plate node PN. The bit line BL may extend vertically in a first direction D1. The active layer ACT may extend laterally in a second direction D2 crossing the first direction D1. The double word line DWL may extend along a third direction D3 crossing the first direction D1 and the second direction D2. The plate node PN of the capacitor CAP may be connected to the plate line PL. The first, second and third directions D1, D2, and D3 may be orthogonal or substantially orthogonal to each other.

The bit line BL may be vertically oriented along the first direction D1. The bit line BL may be referred to as a vertically oriented bit line, a vertically extended bit line, or a pillar-shape bit line. The bit line BL may include a conductive material. The bit line BL may include a silicon-based material, a metal-based material, or a combination thereof. The bit line BL may include polysilicon, metal, metal nitride, metal silicide, or a combination thereof. The bit line BL may include polysilicon, titanium nitride, tungsten, or a combination thereof. For example, the bit line BL may include a stack of titanium nitride and tungsten (TiN/W).

The active layer ACT of the transistor TR may include a hybrid channel CH. The double word line DWL may include a first word line WL1 and a second word line WL2. A gate dielectric layer GD may be disposed either between the hybrid channel CH and the first word line WL1 or the hybrid channel and the second word lines WL2. The hybrid channel CH may have a lateral orientation along the second direction D2. That is, the transistor TR may be a laterally oriented transistor. The bit line BL may be connected to a first end of the hybrid channel CH, and the capacitor CAP may be connected to a second end of the hybrid channel CH.

The double word line DWL may have a line-shape extending in the third direction D3. The active layer ACT may have a bar-shape extending in the second direction D2. The active layer ACT may be laterally arranged from the bit line BL. The double word line DWL may include a pair of a first word line WL1 and a second word line WL2. The first word line WL1 and the second word line WL2 may face each other in the first direction D1 with the active layer ACT interposed therebetween. A gate dielectric layer GD may be formed on the upper and lower surfaces of the active layer ACT. The first word line WL1 may be disposed on the lower surface of the active layer ACT, and the second word line WL2 may be disposed on the upper surface of the active layer ACT. In another embodiment, the positions of the first word line WL1 and the second word line WL2 may be changed.

The first and second word lines WL1 and WL2 may include a metal, a metal mixture, a metal alloy, or a semiconductor material. The first and second word lines WL1 and WL2 may include titanium nitride, tungsten, polysilicon, or a combination thereof. For example, the first and second word lines WL1 and WL2 may include a TiN/W stack in which titanium nitride and tungsten are sequentially stacked. The first and second word lines WL1 and WL2 may include an N-type work function material or a P-type work function material. The N-type work function material may have a low work function lower than 4.5 eV, and the P-type work function material may have a high work function higher than 4.5 eV.

The transistor TR is a cell transistor and may have a double word line DWL. In the double word line DWL, the first word line WL1 and the second word line WL2 may have the same potential. For example, the first word line WL1 and the second word line WL2 form a pair to drive one memory cell MC. The same word line driving voltage may be applied to the first word line WL1 and the second word line WL2.

As such, the memory cell MC according to an embodiment of the present invention may have a double word line DWL in which two world lines, that are the first and second word lines WL1 and WL2, are adjacent to one hybrid channel CH.

In another embodiment, the first word line WL1 and the second word line WL2 may have different potentials. For example, a word line driving voltage may be applied to the first word line WL1, and a ground voltage may be applied to the second word line WL2. The second word line WL2 may be referred to as a back word line or a shield word line. In another embodiment, a ground voltage may be applied to the first word line WL1, and a word line driving voltage may be applied to the second word line WL2.

The gate dielectric layer GD may include silicon oxide, silicon nitride, metal oxide, metal oxynitride, metal silicate, a high-k material, a ferroelectric material, an anti-ferroelectric material, or a combination thereof. The gate dielectric layer GD may include $SiO_2$, $Si_3N_4$, $HfO_2$, $Al_2O_3$, $ZrO_2$, AlON, HfON, HfSiO, HfSiON, HfZrO, or a combination thereof.

The hybrid channel CH may laterally extend in the second direction D2 between the bit line BL and the capacitor CAP.

The capacitor CAP may be laterally disposed along the second direction D2 from the transistor TR. The capacitor CAP may include a storage node SN, a dielectric layer DE on the storage node SN, and a plate node PN on the dielectric layer DE. The storage node SN, the dielectric layer DE, and the plate node PN may be laterally arranged along the second direction D2. The capacitor CAP may have a flat plate shape. For example, the storage node SN, the dielectric layer DE, and the plate node PN may each have a flat plate shape extending vertically along the first direction D1. The plate node PN may be connected to the plate line PL. The storage node SN may be electrically connected to the second end of the active layer ACT. The top surface of the storage node SN may be disposed at the same level as the top surface of the first word line WL1. The bottom surface of the storage node SN may be disposed at the same level as the bottom surface of the second word line WL2.

Each of the storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, and a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN)

stack, silicon germanium may be a gap-fill material filling the inside of the cylinder of the storage node SN, and titanium nitride (TiN) may serve as the plate node PN of the capacitor, and tungsten nitride may be a low-resistance material.

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of about 3.9, and the dielectric layer DE may include a high-k material having a dielectric constant of 4 or more. The high-k material may have a dielectric constant of about 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). In another embodiment, the dielectric layer DE may be formed of a composite layer including two or more layers of the aforementioned high-k material.

The dielectric layer DE may be formed of a zirconium (Zr)-based oxide. The dielectric layer DE may have a stack structure including zirconium oxide ($ZrO_2$). The stack structure including zirconium oxide ($ZrO_2$) may include a $ZrO_2$/$Al_2O_3$ (ZA) stack or a $ZrO_2$/$Al_2O_3$/$ZrO_2$ (ZAZ) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. In another embodiment, the dielectric layer DE may be formed of a hafnium (Hf)-based oxide. The dielectric layer DE may have a stack structure including hafnium oxide ($HfO_2$). The stack structure including hafnium oxide ($HfO_2$) may include a HA ($HfO_2$/$Al_2O_3$) stack or a HAH ($HfO_2$/$Al_2O_3$/$HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a band gap larger than that of the high-k material. The dielectric layer DE may include silicon oxide ($SiO_2$) as a high bandgap material other than the aluminum oxide ($Al_2O_3$). Since the dielectric layer DE includes a high bandgap material, the leakage current may be suppressed. The high bandgap material may be thinner than the high-k material. In another embodiment, the dielectric layer DE may include a laminated structure in which a high-k material and a high-bandgap material are alternately stacked. For example, the dielectric layer DE may include laminated structures of ZAZA ($ZrO_2$/$Al_2O_3$/$ZrO_2$/$Al_2O_3$), ZAZAZ ($ZrO_2$/$Al_2O_3$/$ZrO_2$/$Al_2O_3$/$ZrO_2$/$Al_2O_3$/$ZrO_2$), HAHA ($HfO_2$/$Al_2O_3$/$HfO_2$/$Al_2O_3$) or HAHAH ($HfO_2$/$Al_2O_3$/$HfO_2$/$Al_2O_3$/$Al_2O_3$). In the above laminated structures, aluminum oxide ($Al_2O_3$) may be thinner than zirconium oxide and hafnium oxide.

In another embodiment, the dielectric layer DE may include a stack structure, a laminate structure, or a mutual mixing structure including zirconium oxide, hafnium oxide, or aluminum oxide.

In another embodiment, an interface control layer for improving leakage current may be further formed between the storage node SN and the dielectric layer DE. The interface control layer may include titanium oxide ($TiO_2$). The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with other data storage materials. For example, the data storage materials may be a phase change material, a magnetic tunnel junction (MTJ), or a variable resistance material.

Referring to FIGS. 2 to 4 again, the hybrid channel CH may refer to a structure made of different channel materials. The hybrid channel CH may include an inner channel material CH1 and outer channel materials CH2. For example, the hybrid channel CH may include outer channel materials CH2 having a double structure and an inner channel material CH1 having a single structure, the inner channel material CH1 being disposed between the outer channel materials CH2.

The outer channel materials CH2 may contact the gate dielectric layer GD. The outer channel material CH2 may be disposed between the gate dielectric layer GD and the inner channel material CH1. The outer channel materials CH2 may be closer to the first and second word lines WL1 and WL2 than the inner channel material CH1.

The inner channel material CH1 and the outer channel materials CH2 may have different band gap energies (hereinafter, abbreviated as 'band gap'), and also the inner channel material CH1 and the outer channel materials CH2 may have different field effect mobility (µFE) (hereinafter abbreviated as 'mobility'). The outer channel materials CH2 may have a larger bandgap than the inner channel material CH1. The inner channel material CH1 may have greater mobility than the outer channel material CH2. The inner channel material CH1 may be used as a carrier transport layer. The outer channel materials CH2 may include a high bandgap material, and the inner channel material CH1 may include a high mobility material. The outer channel materials CH2 may include a material having lower mobility than the inner channel material CH1, and the inner channel material CH1 may include a material having a smaller bandgap than the outer channel materials CH2. In other words, the outer channel materials CH2 may be a high bandgap, low mobility material, and the inner channel material CH1 may be a low bandgap, high mobility material.

The hybrid channel CH may include a combination of a plurality of oxide semiconductor materials. The hybrid channel CH may include a stack of at least two oxide semiconductor materials. The inner channel material CH1 and the outer channel materials CH2 may include different oxide semiconductor materials. The outer channel materials CH2 may include an oxide semiconductor material having a larger bandgap than the inner channel material CH1, and the inner channel material CH1 may include an oxide semiconductor material having greater mobility than the outer channel materials CH2.

The hybrid channel CH may include at least two metal atoms selected from the group consisting of Ga (gallium), In (indium), Se (selenium), Mg (magnesium), Zn (zinc), and Ag (silver). The hybrid channel CH may include a stack of at least two oxide semiconductor materials selected from a group consisting of gallium oxide (GaO), indium gallium oxide (InGaO), indium selenium oxide (InSeO), indium magnesium oxide (InMgO), indium gallium zinc oxide (InGaZnO), and indium silver oxide (InAgO). GaO has a larger bandgap than InGaO, InGaO has a larger bandgap than InSeO, and InSeO has a larger bandgap than InMgO. InMgO has a larger bandgap than InGaZnO (IGZO), and InGaZnO has a larger bandgap than InAgO. GaO is less mobile than InGaO, InGaO is less mobile than InSeO, and InSeO is less mobile than InMgO. InMgO is less mobile than InGaZnO, and InGaZnO is less mobile than InAgO. GaO may have the largest bandgap, and InAgO may have the smallest bandgap. GaO may have the least mobility, and InAgO may have the greatest mobility. The bandgap of an oxide semiconductor material such as IGZO may be larger than that of silicon (i.e., 1.1 eV). The band gap of IGZO may be about 3.2 eV, and the band gap of GaO may be about 4 eV or more.

As a first example, the inner channel material CH1 may include InAgO, and the outer channel materials CH2 may include a material having a bandgap larger than that of InAgO. For example, the outer channel materials CH2 may include GaO, InGaO, InSeO, InMgO, or InGaZnO.

As a second example, the outer channel materials CH2 may include GaO, and the inner channel material CH1 may include a material having greater mobility than GaO. For example, the inner channel material CH1 may include InGaO, InSeO, InMgO, InGaZnO, or InAgO.

In this embodiment, the outer channel materials CH2 may be GaO, and the inner channel material CH1 may be IGZO.

In another embodiment, the outer channel materials CH2 may include an oxide semiconductor material containing a carrier inhibitor. The carrier inhibitor contained in the outer channel materials CH2 may include Hf, Si, W, Ti, Sc, Zr, Al, Nb, Ta, Mo, or a combination thereof. The outer channel materials CH2 and the inner channel material CH1 may include GaO, InGaO, InSeO, InMgO, InGaZnO, or InAgO, wherein the outer channel materials CH2 may include a high bandgap material containing a carrier inhibitor and the inner channel material CH1 may include a low bandgap material containing no carrier inhibitor. Carrier inhibitors may increase the bandgap. Accordingly, even if the outer channel materials CH2 and the inner channel material CH1 are the same oxide semiconductor material, the oxide semiconductor material containing the carrier inhibitor may have a larger bandgap than the oxide semiconductor material containing no carrier inhibitor. For example, the outer channel materials CH2 may include zirconium (Zr)-doped IGZO, and the inner channel material CH1 may include zirconium (Zr)-free IGZO.

The oxide semiconductor material containing the carrier inhibitor may include a material having high bond strength and high Lewis acid strength.

The outer channel materials CH2 containing the carrier inhibitor may serve to block the diffusion of hydrogen from the outside. Accordingly, the reliability of the semiconductor memory device may be improved.

Referring to FIGS. 3 and 4 again, the hybrid channel CH may further include a two-dimensional electron gas interface 2DEG between the outer channel material CH2 and the inner channel material CH1 (hereinafter, '2DEG interface'). The 2DEG interface 2DEG may be formed in the inner channel material CH1 having a small bandgap. Electrons may be bound to the 2DEG interface 2DEG, and since the inner channel material CH1 has high mobility, the mobility may be improved.

Referring to FIG. 4 again, the number of carriers may be increased by confining carriers to an interface (refer to 'CR') between the inner channel material CH1 and the outer channel material CH2 because the inner channel material CH1 and the outer channel materials CH2 have different bandgaps. Since the number of carriers is increased, mobility can be improved. Here, the carrier may refer to an electron.

In some embodiments of the present invention, the bandgap of the outer channel materials CH2 may be greater than the bandgap of the inner channel material CH1 by about 0.2 eV or more. The mobility of the inner channel material CH1 may be greater than that of the outer channel materials CH2 by about 5 $cm^2/Vs$ or more. The mobility of the inner channel material CH1 may be about 30 $cm^2/Vs$ or more.

As described above, in the hybrid channel CH disclosed in this embodiment, an inner channel material CH1 and an outer channel material CH2 having different bandgaps are stacked to artificially confine large number of electrons between the inner channel material CH1 and the outer channel materials CH2. Therefore, the carrier concentration and mobility may be increased. By increasing the mobility, the ion may be boosted.

By using the low off leakage characteristic of the hybrid channel CH disclosed in this embodiment, a planar-shape capacitor may be applied as the capacitor CAP, thereby increasing the cell density.

Since the hybrid channel CH disclosed in this embodiment includes oxide semiconductor materials, a junction such as a source/drain region may be omitted. That is, a junction-less structure may be formed.

Figure 5A:
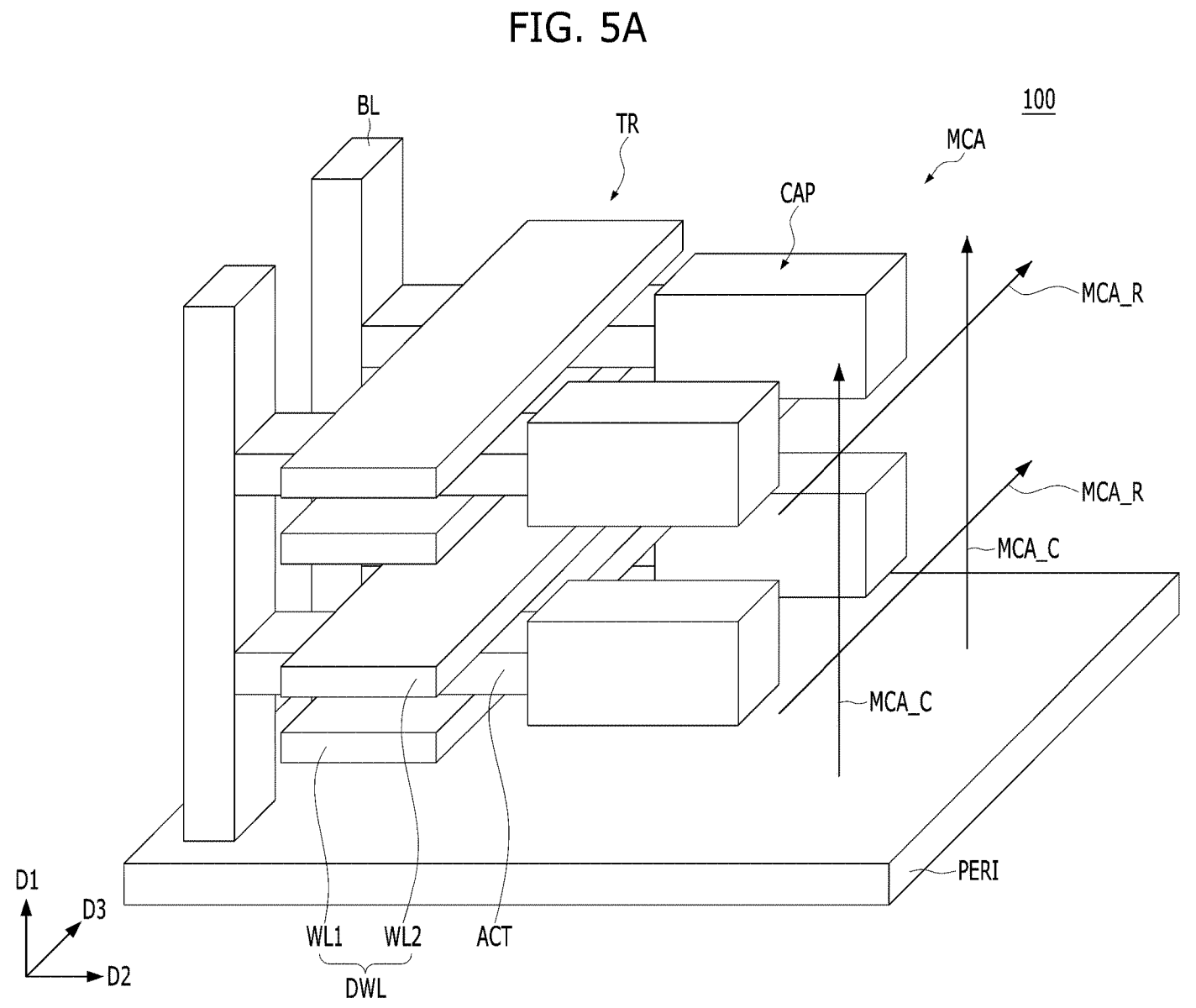
Figure 5B:
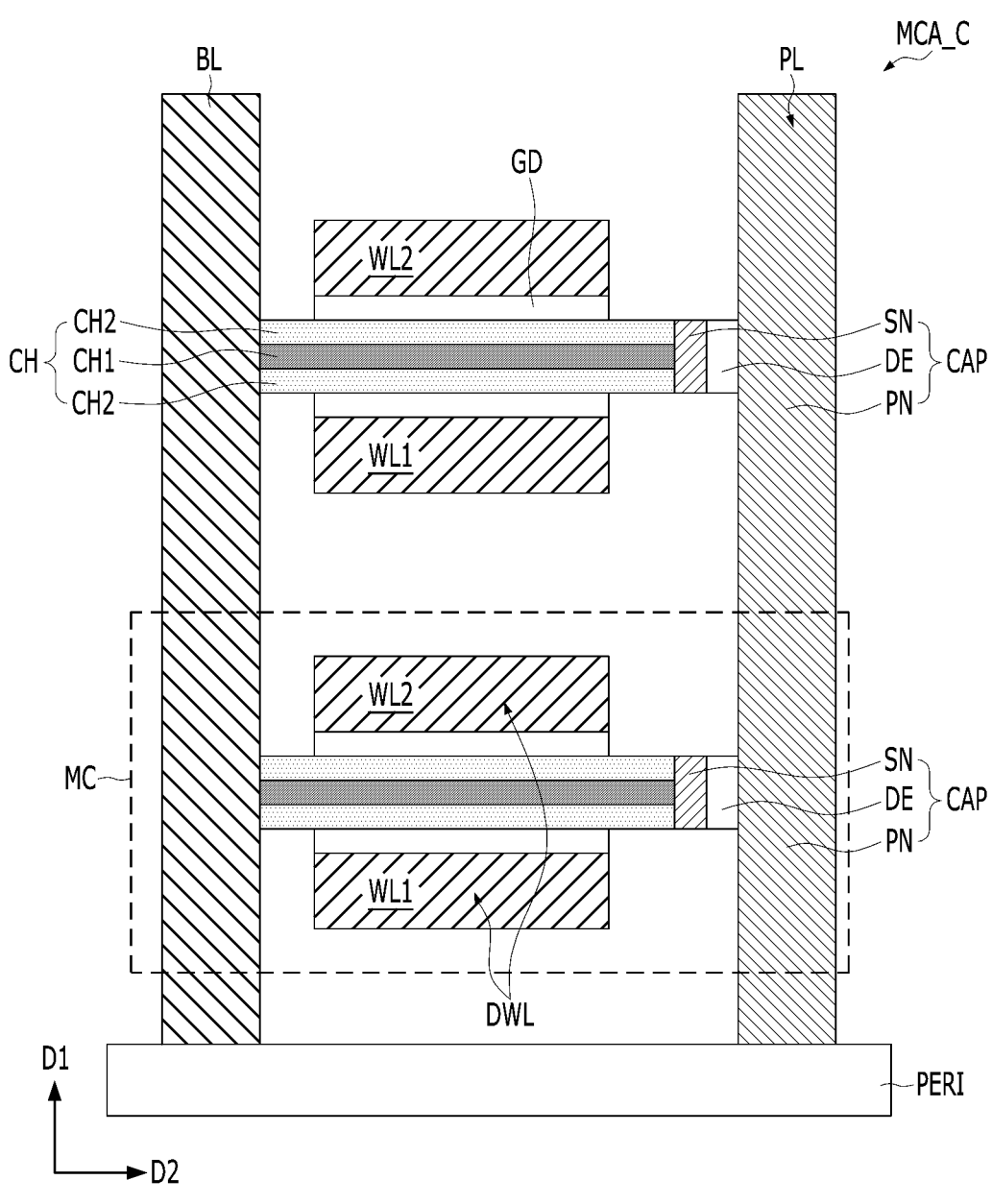
FIG. 5B is a schematic cross-sectional view of a vertical stack of memory cells of the memory cell array of FIG. 5A.
Figure 5C:
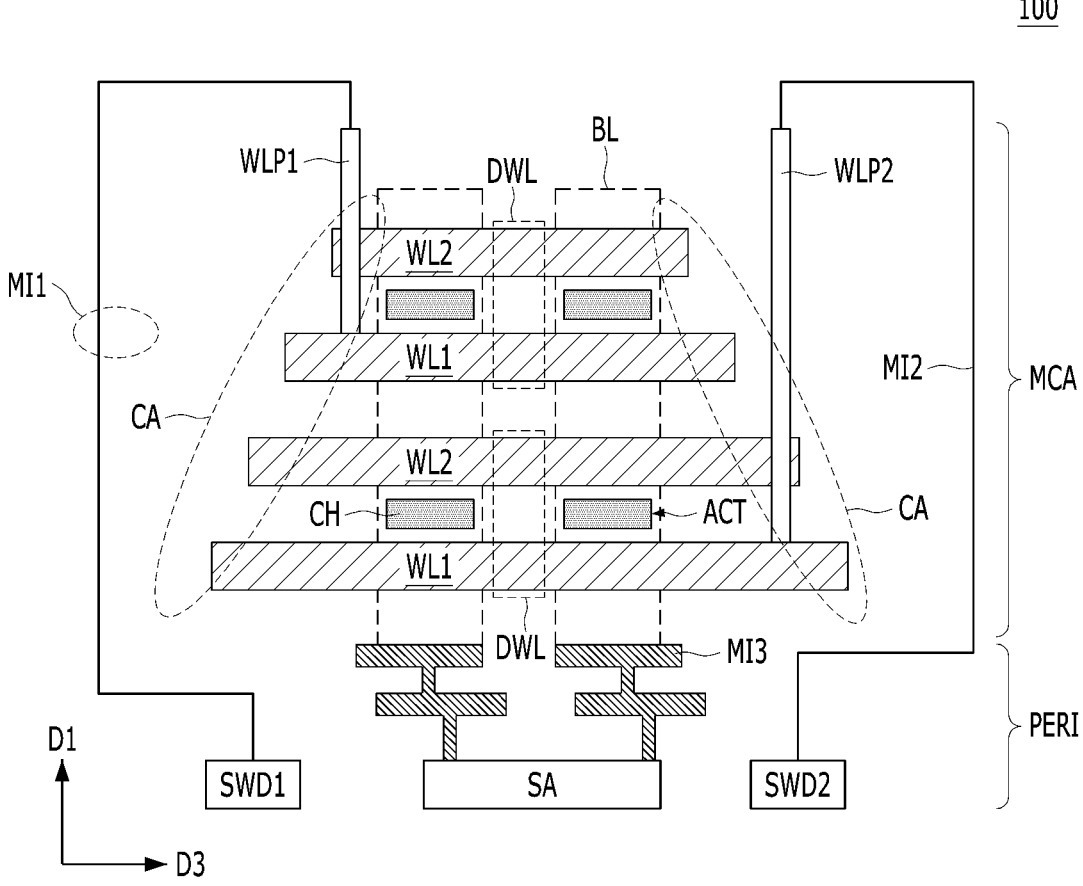
FIG. 5C is a cross-sectional view illustrating contact portions of a pair of double word lines of the memory cell array of FIG. 5A.

FIG. 5A is a schematic perspective view of a memory cell array of a semiconductor memory device according to an embodiment of the present invention. FIG. 5B is a schematic cross-sectional view of a vertical stack of two memory cells of the memory cell array of FIG. 5A of a semiconductor memory device. FIG. 5C is a cross-sectional view illustrating contact portions of a pair of double word lines of the semiconductor memory device.

Referring to FIGS. 5A to 5C, the semiconductor memory device 100 may include a memory cell array MCA. A plurality of memory cells MC of FIGS. 1 and 2 may be arranged along the first to third directions D1, D2, and D3 to form a multi-level memory cell array MCA. The memory cell array MCA may include a three-dimensional array of memory cells MC, and the three-dimensional memory cell array may include a vertical memory cell array MCA_C and a lateral memory cell array MCA_R. The vertical memory cell array MCA_C may refer to an array of memory cells MC vertically arranged in the first direction D1. The lateral memory cell array MCA_R may refer to an array of memory cells MC that are laterally arranged in the second direction D2 and the third direction D3. The vertical memory cell array MCA_C may be referred to as a column array of memory cells MC, and the lateral memory cell array MCA_R may be referred to as a row array of memory cells MC. The bit line BL may be vertically oriented to be connected to the vertical memory cell array MCA_C, and the double word line DWL may be laterally oriented to be connected to the lateral memory cell array MCA_R. A bit line connected to the vertical memory cell array MCA_C may be referred to as a common bit line BL, and vertical memory cell arrays MCA_C neighboring in the third direction D3 may be connected to different common bit lines BL. The double word line connected to the lateral memory cell array MCA_R may be referred to as a common double word line DWL, and the lateral memory cell arrays MCA_R neighboring in the first direction D1 may be connected to different double word lines DWL.

The memory cell array MCA may include a plurality of memory cells MC, and each memory cell MC may include a vertically oriented bit line BL, a laterally oriented active layer ACT, a double word line DWL, and a laterally oriented capacitor CAP. FIG. 5A illustrates a three-dimensional memory cell array including four memory cells MC.

Active layers ACT adjacent to each other in the first direction D1 may contact one bit line BL. The active layers ACT adjacent to each other along the third direction D3 may share one double word line DWL. The capacitors CAP may be connected to the active layers ACT, in a one to one correspondence. The capacitors CAP may share one plate line PL. Each of the active layers ACT may be thinner than each of the first and second word lines WL1 and WL2 of the double word lines DWL.

In the memory cell array MCA, two double word lines DWL may be vertically stacked in the first direction D1. Each double word line DWL may include a pair of a first word line WL1 and a second word line WL2. Between the first word line WL1 and the second word line WL2 of each double word line DWL, a plurality of active layers ACT (e.g., 2 active layers as shown in FIG. 5A) may be disposed and spaced apart from each other in the third direction D3 and arranged to extend laterally in the second direction D2. A plurality of hybrid channels CH may be disposed between the first word line WL1 and the second word line WL2.

Both edge portions of each of the double word lines DWL may have a step shape, and the step shape may define a contact portion CA. Each pair of the first word lines WL1 and the second word lines WL2 may include a contact portion CA on both of their edge portions. Each of the contact portions CA may have a step shape.

A plurality of word line pads WLP1 and WLP2 may be respectively connected to the contact portions CA. The first word line pad WLP1 may be connected to the contact portions CA of the first and second word lines WL1 and WL2 at an upper level. The second word line pad WLP2 may be connected to the contact portions CA of the first and second word lines WL1 and WL2 at a lower level. The first and second word lines WL1 and WL2 at the upper level may be interconnected by the first word line pad WLP1. The first and second word lines WL1 and WL2 at the lower level may be interconnected by the second word line pad WLP2.

The semiconductor memory device 100 may further include a substrate PERI, and the substrate PERI may include a peripheral circuit unit. Hereinafter, the substrate PERI will be abbreviated as a peripheral circuit unit PERI. The bit line BL of the memory cell array MCA may be oriented vertical to the surface of the peripheral circuit unit PERI, and the double word line DWL may be oriented parallel to the surface of the peripheral circuit unit PERI.

The peripheral circuit unit PERI may be located at a lower level than the memory cell array MCA. This may be referred to as a cell over PERI (COP) structure. The peripheral circuit unit PERI may include at least one control circuit for driving the memory cell array MCA. The at least one control circuit of the peripheral circuit unit PERI may include an N-channel transistor, a P-channel transistor, a CMOS circuit, or a combination thereof. The at least one control circuit of the peripheral circuit unit PERI may include an address decoder circuit, a read circuit, a write circuit, and the like. The at least one control circuit of the peripheral circuit unit PERI may include a planar-shape channel transistor, a recess channel transistor, a buried gate transistor, a fin channel transistor (FinFET), and the like.

For example, the peripheral circuit unit PERI may include sub-word line drivers SWD1 and SWD2 and a sense amplifier SA. The first and second word lines WL1 and WL2 at the upper level may be connected to the first sub-word line driver SWD1 through the first word line pads WLP1 and metal interconnections MI1. The first and second word lines WL1 and WL2 at the lower level may be connected to the second sub-word line driver SWD2 through the second word line pads WLP2 and the metal interconnections MI2. The bit lines BL may be connected to the sense amplifier SA through metal interconnections MI3. The metal interconnection MI3 may have a multi-level metal structure including a plurality of vias and a plurality of metal lines.

Figure 6:
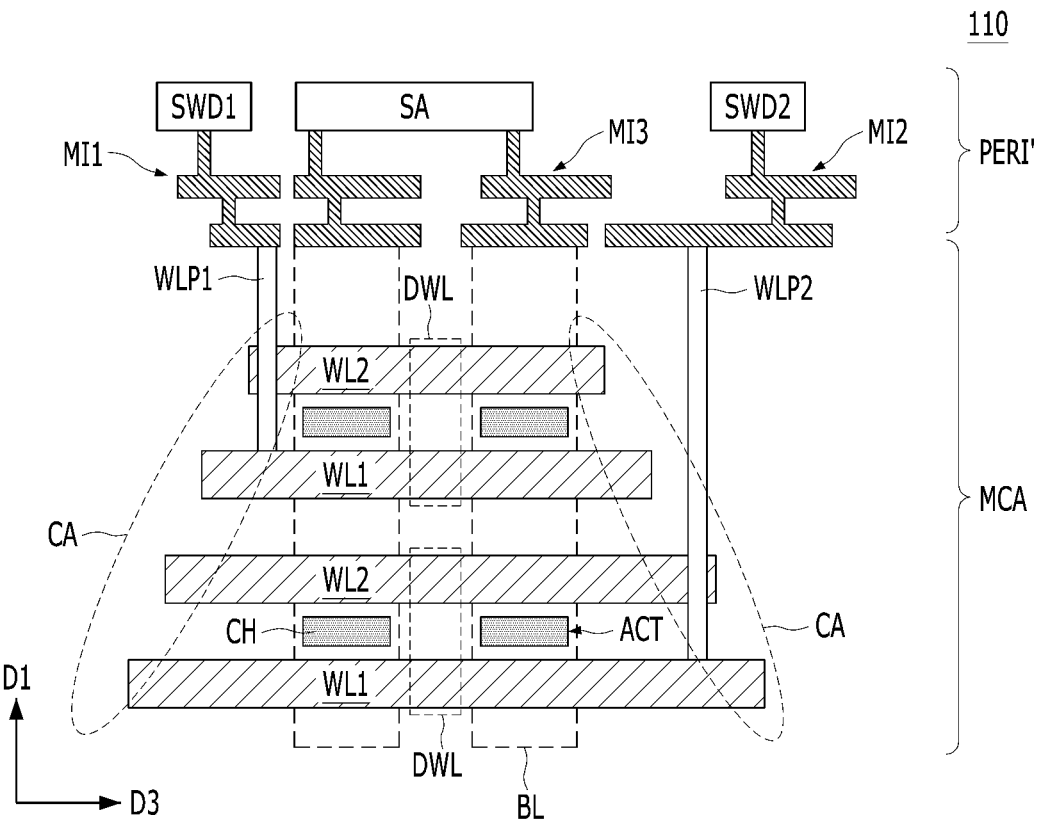
FIG. 6 is a cross-sectional view of a semiconductor memory device according to another embodiment of the present invention.

FIG. 6 is a schematic cross-sectional view of a memory cell array of a semiconductor memory device according to another embodiment of the present invention. FIG. 6 illustrates a semiconductor memory device 110 having a POC structure. In FIG. 6 detailed descriptions of duplicate components with those of FIG. 5C will be omitted.

Referring to FIG. 6, the semiconductor memory device 110 may include a memory cell array MCA and a peripheral circuit unit PERI'. The peripheral circuit unit PERI' may be disposed at a higher level than the memory cell array MCA. This may be referred to as a POC (PERI over Cell) structure.

Figure 7:
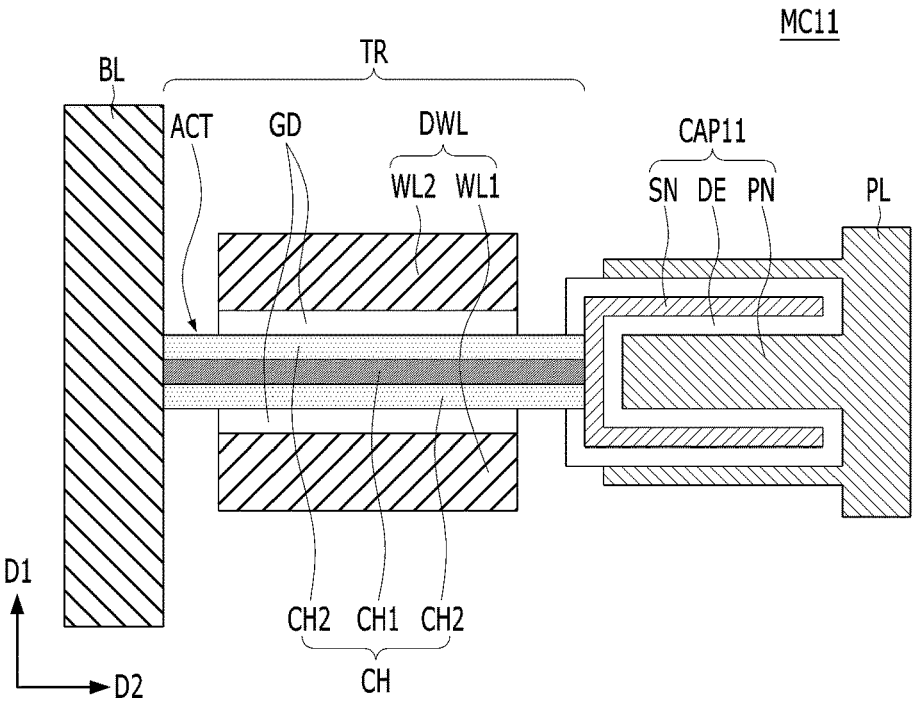
FIG. 7 is a schematic cross-sectional view of a memory cell according to another embodiment of the present invention.

FIG. 7 is a schematic cross-sectional view of a memory cell according to another embodiment of the present invention. In FIG. 7, detailed descriptions of duplicate components with those of FIG. 2 will be omitted.

Referring to FIG. 7, the memory cell MC11 may include a bit line BL, a transistor TR, and a capacitor CAP11.

The transistor TR may include an active layer ACT, gate dielectric layers GD, and a double word line DWL. The capacitor CAP11 may include a storage node SN, a dielectric layer DE, and a plate node PN. The bit line BL may extend vertically in a first direction D1. The active layer ACT may extend laterally in a second direction D2 crossing the first direction D1. The double word line DWL may extend in a third direction D3 crossing both the first direction D1 and the second direction D2. The plate node PN of the capacitor CAP11 may be connected to the plate line PL.

The active layer ACT may include a hybrid channel CH, and the hybrid channel CH may include an inner channel material CH1 and outer channel materials CH2. For example, the hybrid channel CH may include the outer channel materials CH2 having a double structure and an inner channel material CH1 having a single structure interposed between the outer channel materials CH2.

The outer channel materials CH2 may contact the gate dielectric layer GD. The outer channel materials CH2 may be disposed between the gate dielectric layer GD and the inner channel material CH1. The outer channel materials CH2 may be closer to the first and second word lines WL1 and WL2 than the inner channel material CH1.

The inner channel material CH1 and the outer channel materials CH2 may have different bandgaps, and the inner channel material CH1 and the outer channel materials CH2 may have different mobilities µFE.

Unlike the storage node SN of FIG. 2, the storage node SN of the capacitor CAP11 of FIG. 7 may have a cylindrical shape. Accordingly, the capacitor CAP11 may be referred to as a cylindrical capacitor.

Figure 8:
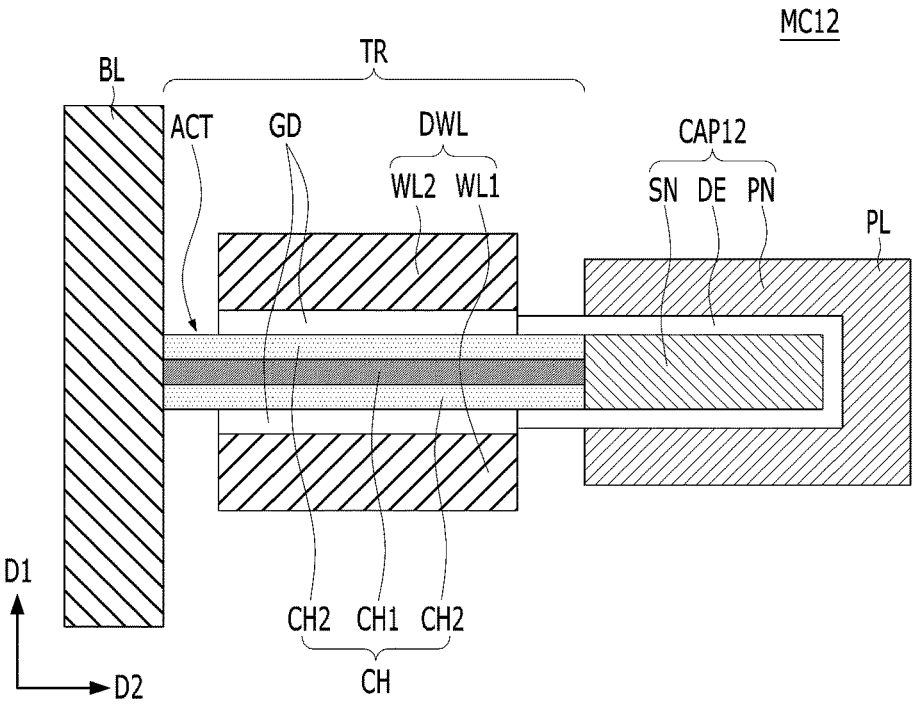
FIG. 8 is a schematic cross-sectional view of a memory cell according to another embodiment of the present invention.

FIG. 8 is a schematic cross-sectional view of a memory cell according to another embodiment of the present invention. In FIG. 8, detailed descriptions of duplicate components with those of FIG. 2 will be omitted.

Referring to FIG. 8, a memory cell MC12 may include a bit line BL, a transistor TR, and a capacitor CAP12.

The transistor TR may include an active layer ACT, gate dielectric layers GD, and a double word line DWL. The capacitor CAP12 may include a storage node SN, a dielectric layer DE, and a plate node PN. The bit line BL may extend vertically in the first direction D1. The active layer ACT may extend laterally in a second direction D2 crossing the first direction D1. The double word line DWL may extend along a third direction D3 crossing both the first direction D1 and the second direction D2. The plate node PN of the capacitor CAP12 may be connected to the plate line PL.

The active layer ACT may include a hybrid channel CH, and the hybrid channel CH may include an inner channel material CH1 and outer channel materials CH2. For example, the hybrid channel CH may include a double structure of the outer channel materials CH2 and a single structure of an inner channel material CH1 interposed between the outer channel materials CH2.

The outer channel materials CH2 may contact the gate dielectric layers GD. The outer channel materials CH2 may be disposed between the gate dielectric layer GD and the inner channel material CH1. The outer channel materials CH2 may be closer to the first and second word lines WL1 and WL2 than the inner channel material CH1.

The inner channel material CH1 and the outer channel materials CH2 may have different bandgaps, and the inner channel material CH1 and the outer channel materials CH2 may have different mobilities μFE.

Unlike the storage nodes SN of FIGS. 2 and 7, the storage node SN of the capacitor CAP12 of FIG. 8 may have a pillar shape. Accordingly, the capacitor CAP12 may be referred to as a pillar-shape capacitor.

FIGS. 9A to 9F are diagrams illustrating a method for fabricating a memory cell according to embodiments of the present invention.

Figure 9A:
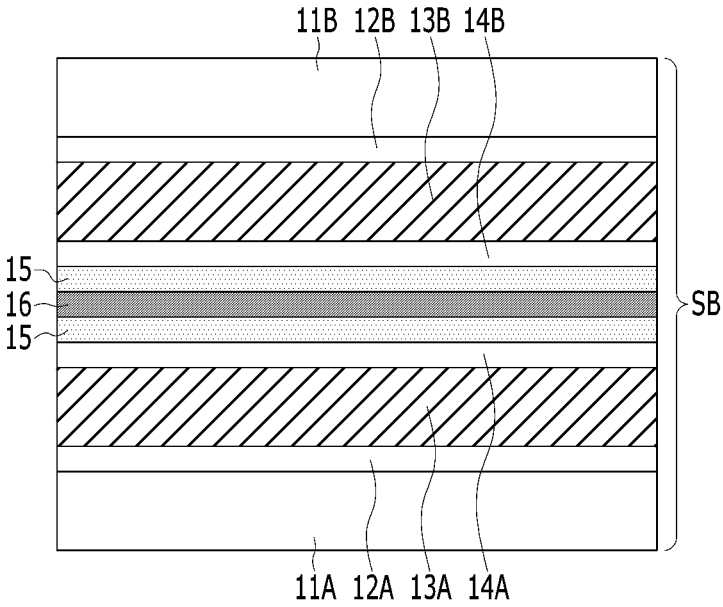
FIGS. 9A to 9F are diagrams illustrating a method for fabricating a memory cell according to an embodiment of the present invention.

As shown in FIG. 9A, a stack body SB may be formed. The stack body SB may include first and second interlayer dielectric layers 11A and 11B, first and second liner materials 12A and 12B, first and second gate materials 13A and 13B, first and second gate dielectric materials 14A and 14B, and first and second channel materials 15 and 16. The first and second channel materials 15 and 16 may be disposed between the first interlayer dielectric layer 11A and the second interlayer dielectric layer 11B. The first gate material 13A may be disposed between the first interlayer dielectric layer 11A and the first channel material 15, and the second gate material 13B may be disposed between the second interlayer dielectric layer 11B and the first channel material 15. The first gate dielectric material 14A may be disposed between the first gate material 13A and the first channel material 15, and the second gate dielectric material 14B may be formed between the second gate material 13B and the first channel material 15. The second channel material 16 may be disposed between a pair of the first channel materials 15. The first liner material 12A may be disposed between the first interlayer dielectric layer 11A and the first gate material 13A, and the second liner material 12B may be disposed between the second interlayer dielectric layer 11B and the second gate material 13B.

The first and second interlayer dielectric layers 11A and 11B may include silicon nitride, and the first and second liner materials 12A and 12B may include silicon oxide. The first and second gate materials 13A and 13B may include a metal-based material. The first and second gate dielectric materials 14A and 14B may include silicon oxide, silicon nitride, a high-k material, or a combination thereof.

The first channel materials 15 may contact the first and second gate dielectric materials 14A and 14B, respectively. The second channel material 16 may be disposed between the first channel materials 15. The first channel material 15 and the second channel material 16 may have different bandgap energies (hereinafter, abbreviated as 'bandgap'), and the second channel material 16 and the first channel material 15 may have different field effect mobility (μFE) (hereinafter abbreviated as 'mobility').

The first channel materials 15 may correspond to the outer channel materials CH2 of FIG. 2, and the second channel material 16 may correspond to the inner channel material CH1 of FIG. 2.

The first channel materials 15 may have a larger bandgap than the second channel material 16. The second channel material 16 may have greater mobility than the first channel materials 15. The first channel materials 15 may include a high bandgap material, and the second channel material 16 may include a high mobility material. The first channel materials 15 may include a material having less mobility than the second channel material 16, and the second channel material 16 may include a material having a smaller bandgap than the first channel materials 15. In other words, the first channel materials may be a high bandgap, low mobility material, and the second channel materials 16 may be a low bandgap, high mobility material.

The first and second channel materials 15 and 16 may include a combination of a plurality of oxide semiconductor materials. The first and second channel materials 15 and 16 may include different oxide semiconductor materials. The first channel materials 15 may include an oxide semiconductor material having a larger bandgap than the second channel material 16, and the second channel material 16 may include an oxide semiconductor material having greater mobility than the first channel materials 15.

Each of the first and second channel materials 15 and 16 may include at least one of the oxide semiconductor materials selected from a group consisting of gallium oxide (GaO), indium gallium oxide (InGaO), indium selenium oxide (InSeO), indium magnesium oxide (InMgO), indium gallium zinc oxide (InGaZnO), and indium silver oxide (InAgO). GaO has a larger bandgap than InGaO, InGaO has a larger bandgap than InSeO, and InSeO has a larger bandgap than InMgO. InMgO has a larger bandgap than InGaZnO, and InGaZnO has a larger bandgap than InAgO. GaO is less mobile than InGaO, InGaO is less mobile than InSeO, and InSeO is less mobile than InMgO. InMgO is less mobile than InGaZnO, and InGaZnO is less mobile than InAgO. GaO may have the largest bandgap, and InAgO may have the smallest bandgap. GaO may have the least mobility, and InAgO may have the greatest mobility. The bandgap of an oxide semiconductor material such as IGZO may be larger than that of silicon (i.e., 1.1 eV). The bandgap of IGZO may be about 3.2 eV, and the bandgap of GaO may be about 4 eV or more.

As a first example, the second channel material 16 may include InAgO, and the first channel materials 15 may include a material having a bandgap greater than that of InAgO. For example, the first channel materials 15 may include GaO, InGaO, InSeO, InMgO, or InGaZnO.

As a second example, the first channel materials 15 may include GaO, and the second channel material 16 may include a material having greater mobility than GaO. For example, the second channel material 16 may include InGaO, InSeO, InMgO, InGaZnO, or InAgO.

In this embodiment, the first channel materials 15 may be GaO, and the second channel material 16 may be IGZO.

In another embodiment, the first channel material 15 may include an oxide semiconductor material containing a carrier inhibitor. The carrier inhibitor contained in the first channel material 15 may include Hf, Si, W, Ti, Sc, Zr, Al, Nb, Ta, Mo, or a combination thereof. The first channel material 15 and the second channel material 16 may include GaO, InGaO, InSeO, InMgO, InGaZnO or InAgO, wherein the first channel material 15 includes a high bandgap material containing a carrier inhibitor and the second channel material 16 may include a low bandgap material containing no carrier inhibitor. Carrier inhibitors may increase the bandgap. Therefore, even if the first channel material 15 and the second channel material 16 are the same oxide semiconductor material, the oxide semiconductor material containing the carrier inhibitor has a larger bandgap than the oxide semiconductor material containing no carrier inhibitor. For example, the first channel material 15 may include zirconium (Zr)-doped IGZO, and the second channel material 16 may include zirconium (Zr)-free IGZO.

The oxide semiconductor material containing the carrier inhibitor may include a material having high bond strength and high Lewis acid strength.

Figure 9B:
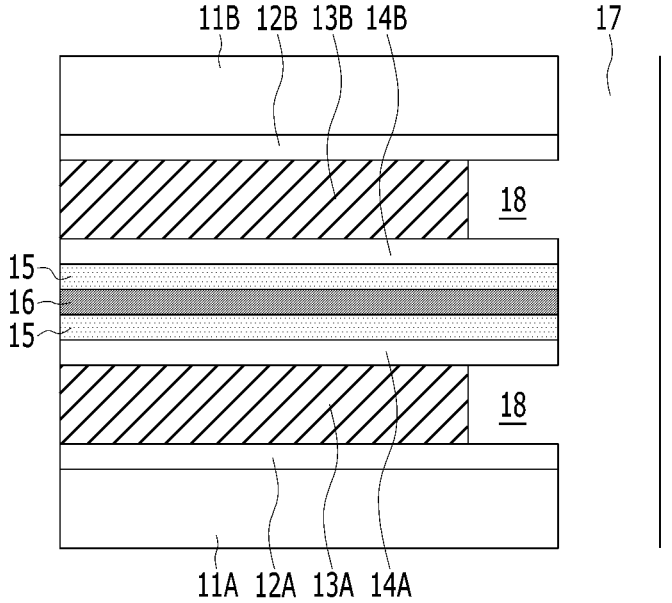

As shown in FIG. 9B, a portion of the stack body SB may be etched to form a first opening 17. The first opening 17 may extend vertically through the stack body SB.

Next, the first and second gate materials 13A and 13B may be selectively etched through the first opening 17 to form first recesses 18.

Figure 9C:
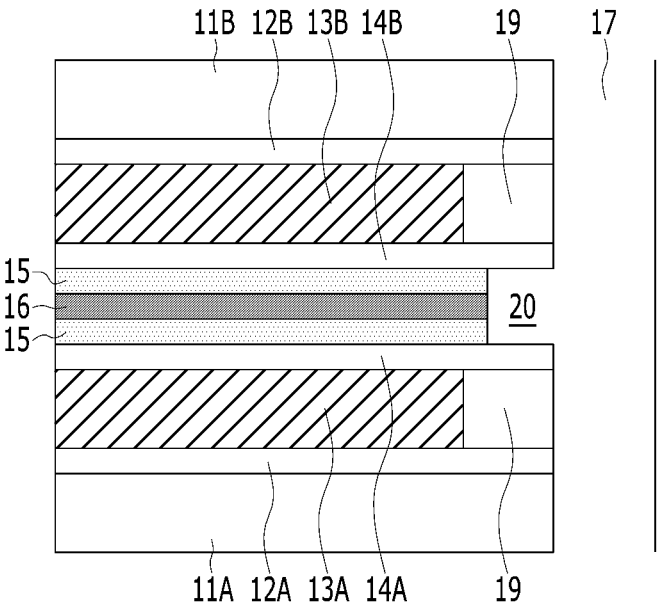

As shown in FIG. 9C, first protective layers 19 filling the first recesses 18 may be formed. The first protective layers 19 may include silicon oxide. For example, in order to form the first protective layers 19, the first recesses 18 may be filled with silicon oxide and the silicon oxide may be selectively etched.

Next, a storage node opening 20 may be formed by selectively recessing the first and second channel materials 15 and 16. The storage node opening 20 may be disposed between the first gate dielectric material 14A and the second gate dielectric material 14B.

Figure 9D:
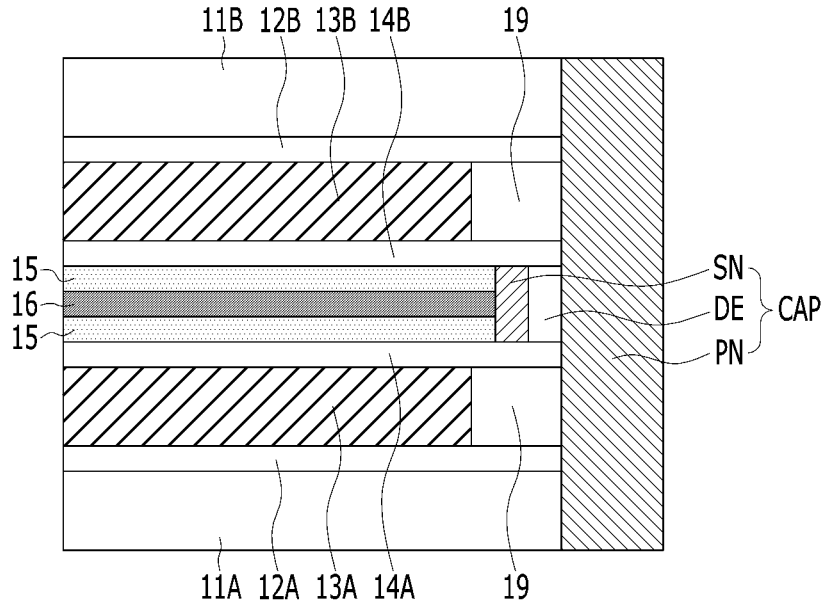

As shown in FIG. 9D, a capacitor CAP may be formed. The capacitor CAP may include a storage node SN, a dielectric layer DE, and a plate node PN.

First, a storage node SN may be formed in the storage node opening 20. The storage node SN may be connected to one end of the first and second channel materials 15 and 16. To form the storage node SN, a conductive material may be formed in the storage node opening 20 and the first opening 17 and then the conductive material may be selectively etched. The storage node SN may be formed only in the storage node opening 20.

Next, a dielectric layer DE may be formed on the storage node SN. In order to form the dielectric layer DE, the dielectric material may be formed on the storage node SN and then the dielectric material may be selectively etched. The dielectric layer DE may not remain in the first opening 17.

Next, a plate node PN may be formed on the dielectric layer DE. The plate node PN may fill the first opening 17. To form the plate node PN, a conductive material may be formed to fill the first opening 17, and then the conductive material may be selectively etched.

Figure 9E:
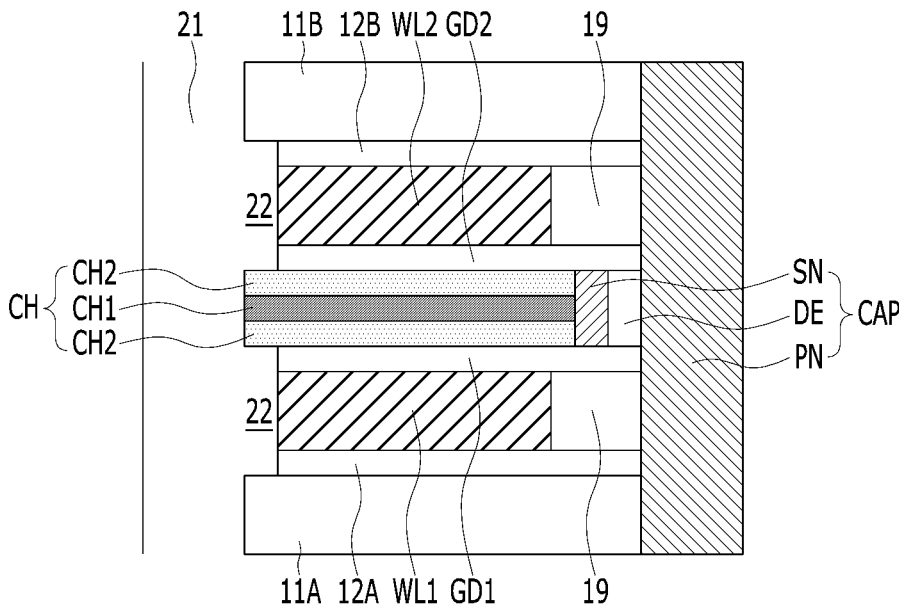

As shown in FIG. 9E, a second opening 21 may be formed. The second opening 21 may be formed by etching another portion of the stack body SB shown in FIGS. 9A to 9D. The second opening 21 may extend vertically through the stack body SB. The first and second liner materials 12A and 12B, the first and second gate dielectric materials 14A and 14B, the first and second gate materials 13A and 13B, and the first and second channel materials 15 and 16 may be etched to form the second opening 21.

A hybrid channel CH may be formed between the first gate dielectric material 14A and the second gate dielectric material 14B by etching the first and second channel materials 15 and 16, and the hybrid channel CH may include the outer channels CH2 and the inner channel CH1. The outer channels CH2 may be formed by etching the first channel materials 15, and the inner channel CH1 may be formed by etching the second channel material 16.

Next, the first and second liner materials 12A and 12B and the first and second gate materials 13A and 13B may be selectively recessed. Accordingly, the second recesses 22 extending from the second opening 21 may be formed. The first and second liner materials 12A and 12B, the first and second gate dielectric materials 14A and 14B, and first and second gate materials 13A and 13B may be etched to form the second recesses 22.

As the second recesses 22 are formed, first and second word lines WL1 and WL2 and first and second gate dielectric layers GD1 and GD2 may be formed. The first and second word lines WL1 and WL2 may be formed by etching the first and second gate materials 13A and 13B, respectively. The first and second gate dielectric layers GD1 and GD2 may be formed by etching the first and second gate dielectric materials 14A and 14B, respectively.

A hybrid channel CH may be disposed between the first gate dielectric layer GD1 and the second gate dielectric layer GD2, and the hybrid channel CH may include outer channels CH2 and an inner channel CH1. The outer channels CH2 may directly contact the first and second gate dielectric layers GD1 and GD2, and the inner channel CH1 may be disposed between the outer channels CH2.

Figure 9F:
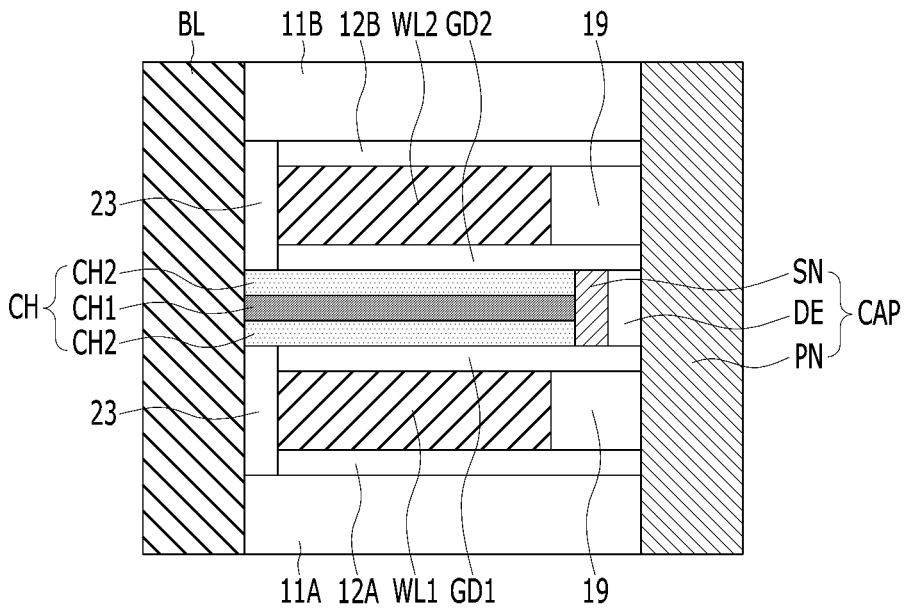

As shown in FIG. 9F, second protective layers 23 filling the second recesses 22 may be formed. The second protective layers 23 may include silicon oxide. For example, the second recesses 22 may be filled with silicon oxide and the silicon oxide may be selectively etched in order to form the second protective layers 23.

Next, a bit line BL filling the second opening 21 may be formed. The storage node SN may be connected to a first end of the hybrid channel CH, and the bit line BL may be connected to a second end of the hybrid channel CH.

FIGS. 10A to 10K are diagrams illustrating a method for fabricating a memory cell according to another embodiment of the present invention. The method illustrated in FIGS. 10A to 10K may be similar to the method shown in FIGS. 9A to 9F.

Figure 10A:
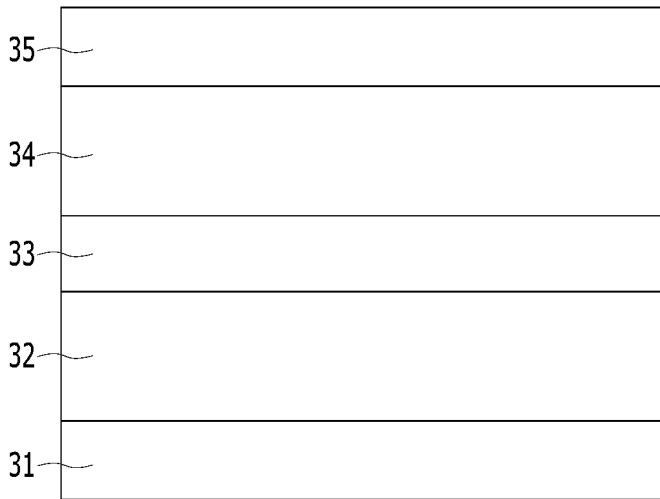
FIGS. 10A to 10K are diagrams illustrating a method for fabricating a memory cell according to another embodiment of the present invention.

As shown in FIG. 10A, a stack body may be formed. The stack body may include first and second interlayer dielectric layers 31 and 35, first and second sacrificial materials 32 and 34, and a channel-level sacrificial material 33. The first and second sacrificial materials 32 and 34 may be disposed between the first interlayer dielectric layer 31 and the second interlayer dielectric layer 35, and the channel-level sacrificial material 33 may be disposed between the first sacrificial material 32 and the second sacrificial material 34. The first and second interlayer dielectric layers 31 and 35 may include silicon oxide, and the first and second sacrificial materials 32 and 34 may include silicon nitride. The channel-level sacrificial material 33 may include polysilicon.

Figure 10B:
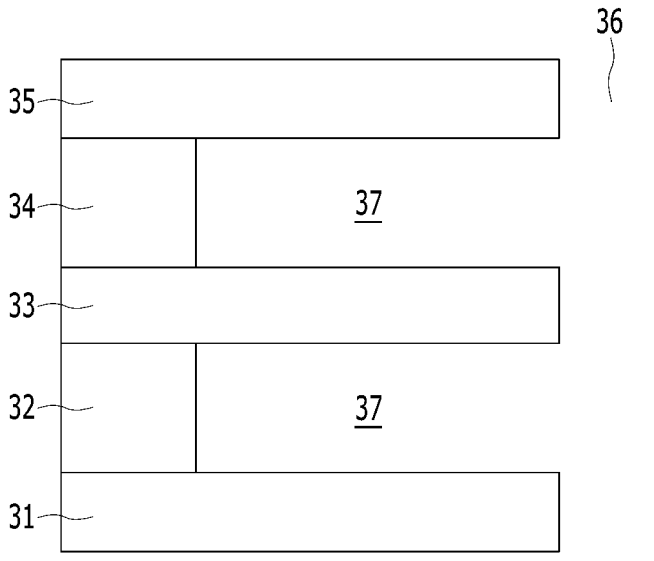

As shown in FIG. 10B, a portion of the stack body may be etched to form the first opening 36. The first opening 36 may extend vertically through the stack body.

Next, the first and second sacrificial materials 32 and 34 may be selectively etched through the first opening 36 to form first recesses 37.

Figure 10C:
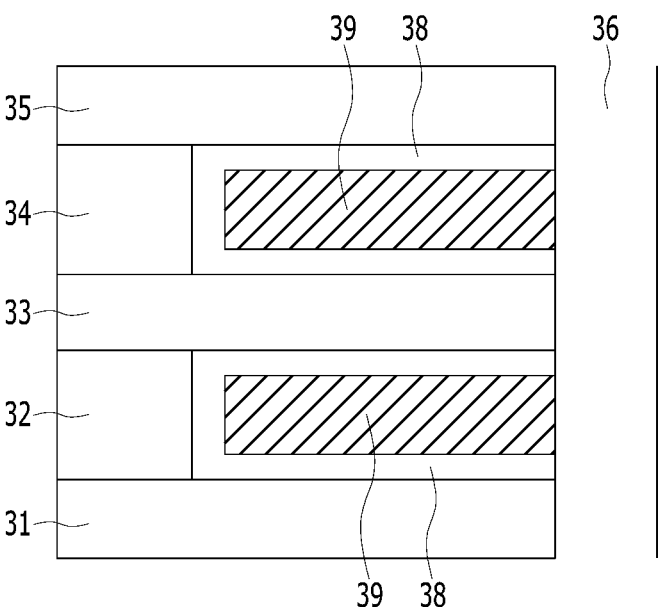

As shown in FIG. 10C, a gate dielectric material 38 and a gate material 39 filling the first recesses 37 may be formed, by first forming the gate dielectric material 38 conformally inside the first recesses 37 and filling the remaining space inside the first recesses with the gate material 39.

Figure 10D:
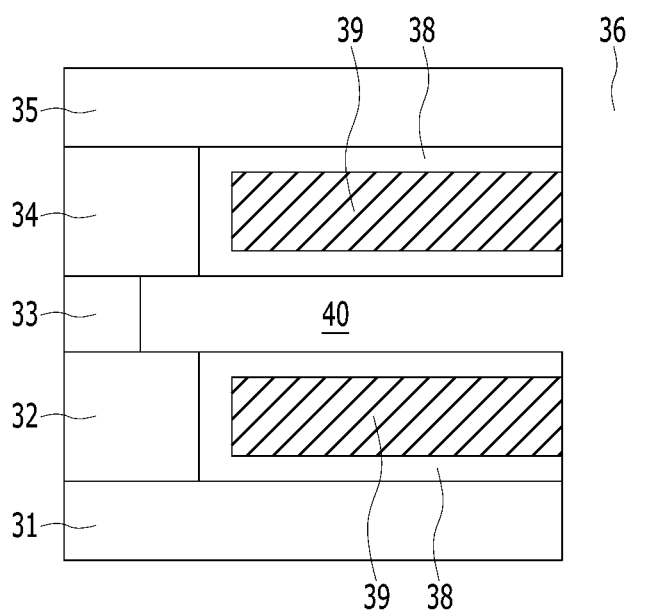

As shown in FIG. 10D, a portion of the channel-level sacrificial material 33 may be selectively recessed to form the channel-level opening 40.

Figure 10E:
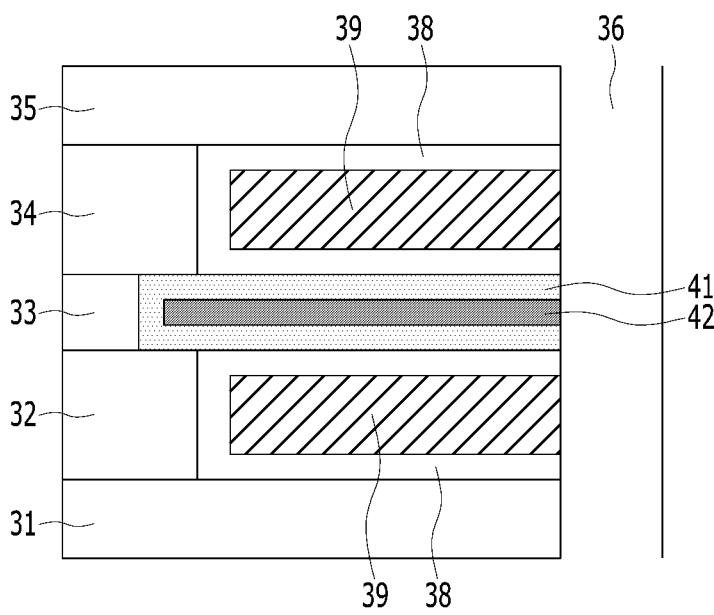

As shown in FIG. 10E, a first channel material 41 and a second channel material 42 may be sequentially formed in the channel-level opening 40. For example, the first channel material 41 may be formed conformally inside the channel-level opening 40 and then the second channel material 42 may be formed on the first channel material 41 to fill the channel-level opening 40.

The first channel material 41 and the second channel material 42 may have different bandgap energies (hereinafter, abbreviated as 'bandgap'). The second channel material 42 and the first channel material 41 may have different field effect mobility ($\mu$FE) (hereinafter abbreviated as 'mobility').

The first channel material 41 may correspond to the outer channel materials CH2 of FIG. 2, and the second channel material 42 may correspond to the inner channel material CH1 of FIG. 2.

The first channel material 41 may have a larger bandgap than the second channel material 42. The second channel material 42 may have greater mobility than the first channel materials 41. The first channel material 41 may include a high bandgap material, and the second channel material 42 may include a high mobility material. The first channel material 41 may include a material having less mobility than the second channel material 42, and the second channel material 42 may have a smaller bandgap than the first channel material 41. In other words, the first channel material 41 may be a high bandgap, low mobility material, and the second channel material 42 may be a low bandgap, high mobility material.

The first and second channel materials 41 and 42 may include a combination of a plurality of oxide semiconductor materials. The first and second channel materials 41 and 42 may include different oxide semiconductor materials. The first channel material 41 may include an oxide semiconductor material having a bandgap larger than that of the second channel material 42, and the second channel material 42 may include an oxide semiconductor material having greater mobility than the first channel materials 41.

Each of the first and second channel materials 41 and 42 may include at least one oxide semiconductor material selected from the group consisting of gallium oxide (GaO), indium gallium oxide (InGaO), indium selenium oxide (InSeO), indium magnesium oxide (InMgO), indium gallium zinc oxide (InGaZnO), and indium silver oxide (InAgO). GaO has a larger bandgap than InGaO, InGaO has a larger bandgap than InSeO, and InSeO has a larger bandgap than InMgO. InMgO has a larger bandgap than InGaZnO, and InGaZnO has a larger bandgap than InAgO. GaO is less mobile than InGaO, InGaO is less mobile than InSeO, and InSeO is less mobile than InMgO. InMgO is less mobile than InGaZnO, and InGaZnO is less mobile than InAgO. GaO may have the largest bandgap, and InAgO may have the smallest bandgap. GaO may have the least mobility, and InAgO may have the greatest mobility. The bandgap of an oxide semiconductor material such as IGZO may be larger than that of silicon (1.1 eV). The bandgap of IGZO may be about 3.2 eV, and the bandgap of GaO may be about 4 eV or more.

As a first example, the second channel material 42 may include InAgO, and the first channel material 41 may include a material having a bandgap greater than that of InAgO. For example, the first channel material 41 may include GaO, InGaO, InSeO, InMgO, or InGaZnO.

As a second example, the first channel material 41 may include GaO, and the second channel material 42 may include a material having greater mobility than GaO. For example, the second channel material 42 may include InGaO, InSeO, InMgO, InGaZnO, or InAgO.

In this embodiment, the first channel material 41 may be GaO, and the second channel material 42 may be InGaZnO (IGZO).

In another embodiment, the first channel material 41 may include an oxide semiconductor material containing a carrier inhibitor. The carrier inhibitor contained in the first channel material 41 may include Hf, Si, W, Ti, Sc, Zr, Al, Nb, Ta, Mo, or a combination thereof. The first channel material 41 and the second channel material 42 may include GaO, InGaO, InSeO, InMgO, InGaZnO, or InAgO, wherein the first channel material 41 may include a high bandgap material containing a carrier inhibitor and the second channel material 42 may include a low bandgap material containing no carrier inhibitor. Carrier inhibitors may increase the bandgap. Therefore, even if the first channel material 41 and the second channel material 42 are the same oxide semiconductor material, the oxide semiconductor material containing the carrier inhibitor has a larger bandgap than the oxide semiconductor material containing no carrier inhibitor. For example, the first channel material 41 may include zirconium (Zr)-doped IGZO, and the second channel material 42 may include zirconium (Zr)-free IGZO.

The oxide semiconductor material containing the carrier inhibitor may include a material having high bond strength and high Lewis acid strength.

Figure 10F:
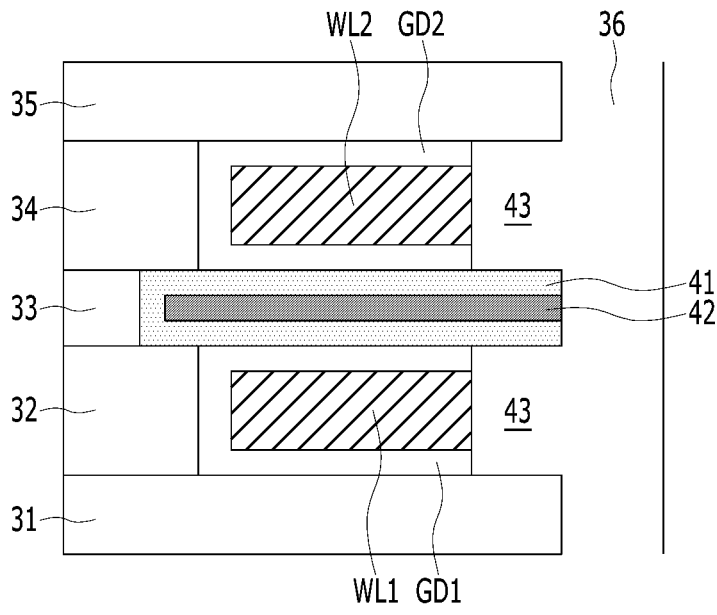

As shown in FIG. 10F, the gate dielectric material 38 and a portion of the gate material 39 may be selectively recessed to form openings 43. Accordingly, the first and second word lines WL1 and WL2 and the first and second gate dielectric layers GD1 and GD2 may be formed. The first and second word lines WL1 and WL2 may be formed by etching the gate material 39. The first and second gate dielectric layers GD1 and GD2 may be formed by etching the gate dielectric material 38.

Figure 10G:
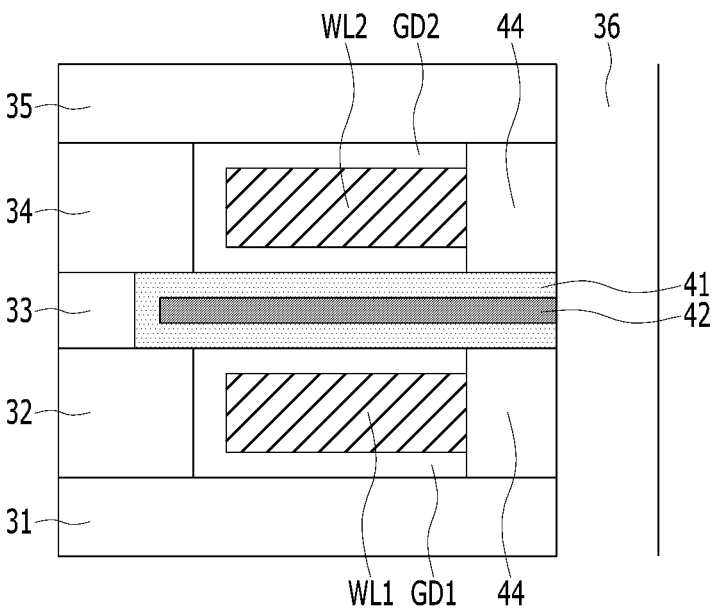

As shown in FIG. 10G, first protective layers 44 may be formed. The first protective layers 44 may include silicon oxide, silicon nitride, or a combination thereof.

Figure 10H:
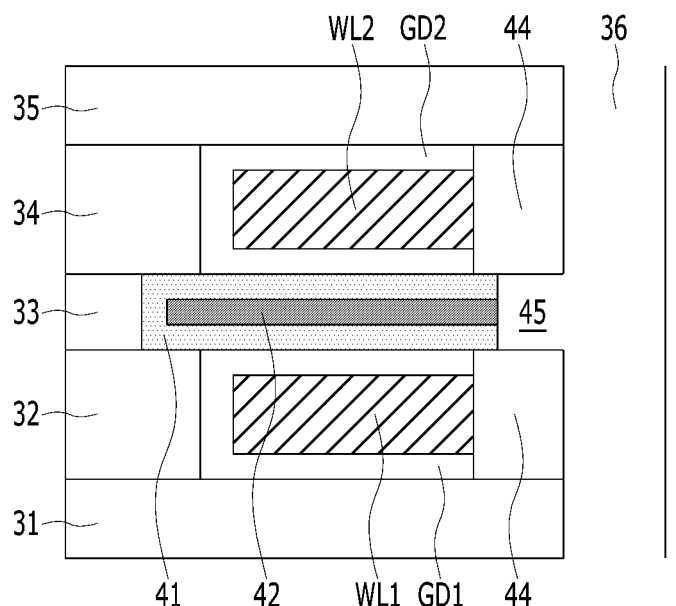

As shown in FIG. 10H, a portion of the first and second channel materials 41 and 42 may be selectively recessed to form the storage node opening 45. The storage node opening 45 may be disposed between the first protective layers 44.

Figure 10I:
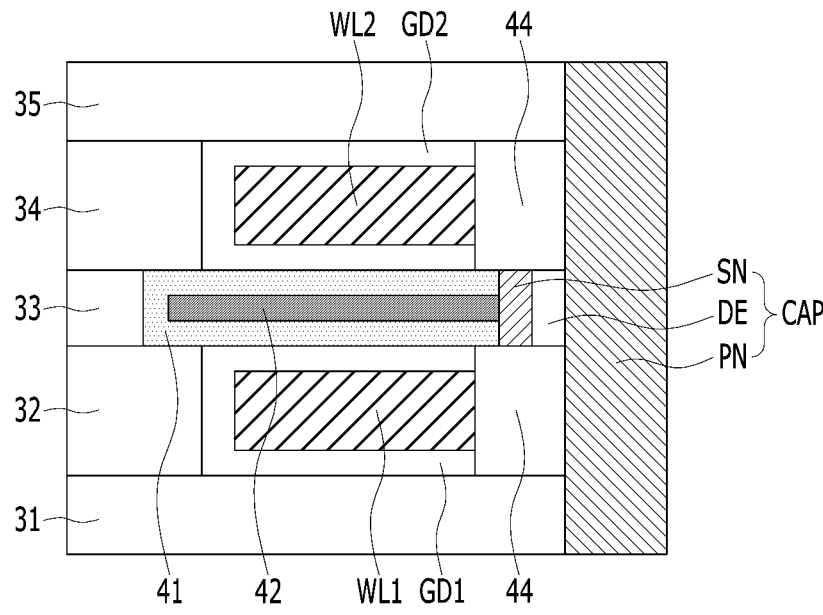

As shown in FIG. 10I, a capacitor CAP may be formed. The capacitor CAP may include a storage node SN, a dielectric layer DE, and a plate node PN.

First, a storage node SN may be formed in the storage node opening 45. The storage node SN may be connected to one end of the first and second channel materials 41 and 42. To form the storage node SN, a conductive material may be formed in the storage node opening 45 and the first opening 36 and then the conductive material may be selectively etched from the first opening 36. The storage node SN may be formed only in the storage node opening 45.

Next, the dielectric layer DE may be formed on the storage node SN. In order to form the dielectric layer DE, a dielectric material may be formed on the storage node SN and then selectively etched so that the dielectric layer DE may not remain in the first opening 36.

Next, a plate node PN may be formed on the dielectric layer DE. The plate node PN may fill the first opening 36. To form the plate node PN, a conductive material may be formed to fill the first opening 36, and then the conductive material may be selectively etched.

Figure 10J:
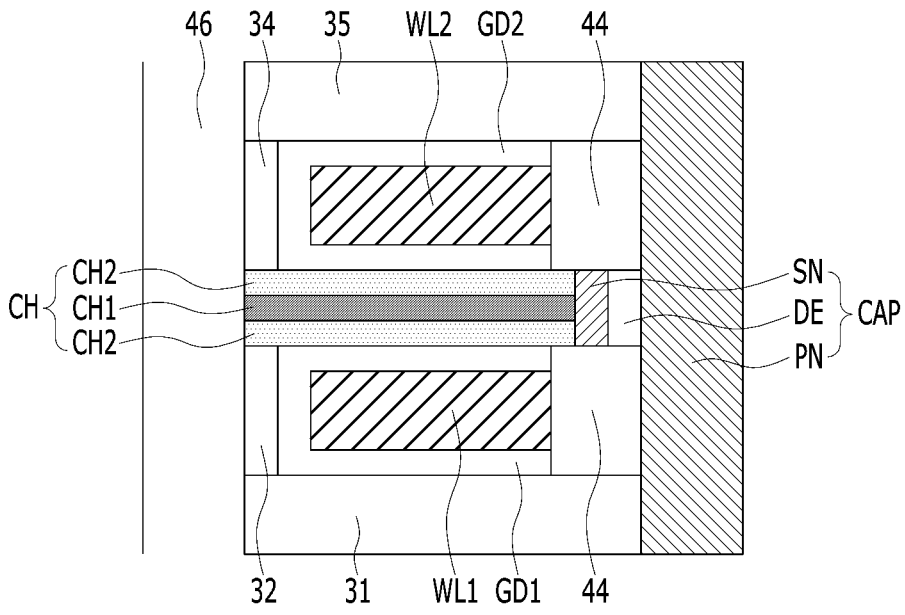

As shown in FIG. 10J, a second opening 46 may be formed. The second opening 46 may be formed by etching another portion of the stack body of FIGS. 10A to 10I. The second opening 46 may extend vertically through the stack body. To form the second opening 46, the remaining materials, for example, the first and second interlayer dielectric layers 31 and 35, the first and second sacrificial materials 32 and 34, the channel-level sacrificial material 33, and the first and second channel materials 41 and 42 may be etched.

A hybrid channel CH may be formed by etching the first and second channel materials 41 and 42, and the hybrid channel CH may include outer channels CH2 and an inner channel CH1. The outer channels CH2 may be formed by etching the first channel material 41, and the inner channel CH1 may be formed by etching the second channel material 42.

Figure 10K:
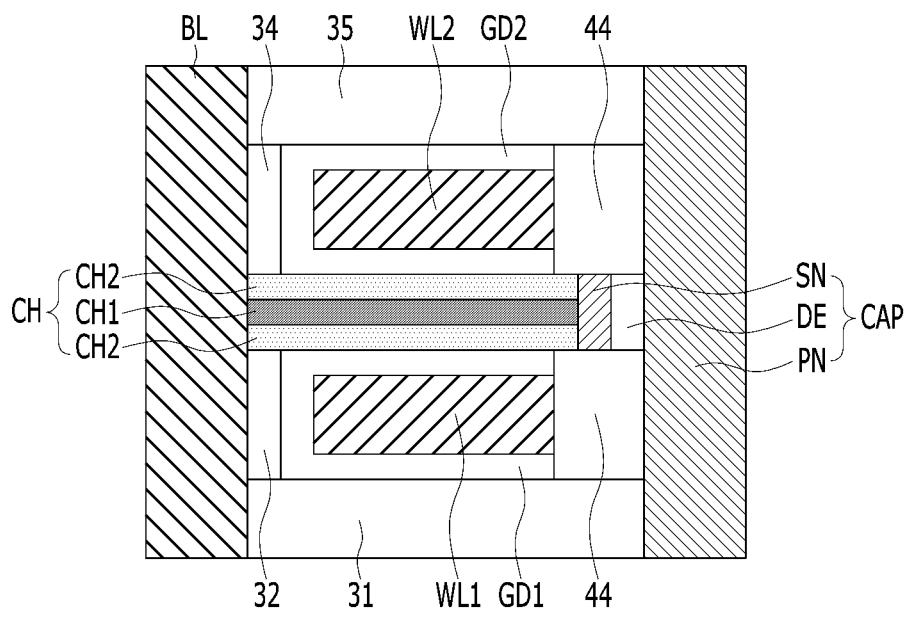

As shown in FIG. 10K, a bit line BL filling the second opening 46 may be formed. The storage node SN may be connected to a first end of the hybrid channel CH, and the bit line BL may be connected to a second end of the hybrid channel CH.

The present invention described above is not limited to the above-described embodiments and the accompanying drawings, and it will be apparent to those skilled in the art that various substitutions, modifications, and changes may be made thereto without departing from the spirit and scope of the present invention.

What is claimed is:

1. A semiconductor memory device comprising:
a laterally oriented hybrid channel layer including outer channel layers and an inner channel layer interposed between the outer channel layers, wherein lateral lengths of the outer channel layers are same with that of the inner channel layer;
a laterally oriented double word line with the hybrid channel layer interposed therebetween;
a vertically oriented bit line connected to a first end of the hybrid channel layer; and
a capacitor connected to a second end of the hybrid channel layer.

2. The semiconductor memory device of claim 1, wherein the outer channel layers have a greater bandgap than the inner channel layer.

3. The semiconductor memory device of claim 1, wherein the inner channel layer has a greater mobility than the outer channel layers.

4. The semiconductor memory device of claim 1, wherein the outer channel layers include a first oxide semiconductor material,
the inner channel layer includes a second oxide semiconductor material, and
the first oxide semiconductor material has a greater bandgap than the second oxide semiconductor material.

5. The semiconductor memory device of claim 1, wherein the outer channel layers include a first oxide semiconductor material,
the inner channel layer includes a second oxide semiconductor material, and the second oxide semiconductor material has a greater mobility than the first oxide semiconductor material.

6. The semiconductor memory device of claim 1, wherein the outer channel layers include a first oxide semiconductor material,
the inner channel layer includes a second oxide semiconductor material,
the first oxide semiconductor material includes a hydrogen diffusion inhibitor, and
the first oxide semiconductor material includes a higher concentration of the hydrogen diffusion inhibitor than the second oxide semiconductor material.

7. The semiconductor memory device of claim 6, wherein the hydrogen diffusion inhibitor includes Hf, Si, W, Ti, Sc, Zr, Al, Nb, Ta, Mo, or a combination thereof.

8. The semiconductor memory device of claim 1, wherein both the outer channel layers and the inner channel layer include GaO, InGaO, InSeO, InMgO, InGaZnO, or InAgO,
the outer channel layers have a greater bandgap than the inner channel layer, and
the inner channel layer has greater mobility than the outer channel layers.

9. The semiconductor memory device of claim 1, wherein both the outer channel layers the inner channel layer include GaO, InGaO, InSeO, InMgO, InGaZnO, or InAgO, and
the outer channel layers include a hydrogen diffusion inhibitor selected from a group consisting of Hf, Si, W, Ti, Sc, Zr, Al, Nb, Ta, and Mo.

10. The semiconductor memory device of claim 1, wherein
the inner channel layer includes InGaZnO,
the outer channel layers include InGaZnO containing a hydrogen diffusion inhibitor, and
the hydrogen diffusion inhibitor includes Hf, Si, W, Ti, Sc, Zr, Al, Nb, Ta, or Mo.

11. The semiconductor memory device of claim 1, wherein the capacitor includes a planar-shape storage node, a cylinder-shape storage node, or a pillar-shape storage node.

12. A semiconductor memory device comprising:
a substrate;
a plurality of hybrid channel layers stacked in a vertical direction to the substrate;
a plurality of laterally oriented double word lines with each of the hybrid channel layers interposed between each of the double word lines;
a vertically oriented bit line commonly connected to a first end of each of the hybrid channel layers; and
capacitors respectively connected to second ends of the hybrid channel layers,
wherein each of the hybrid channel layers includes:
high bandgap oxide semiconductor layers neighboring the laterally oriented double word lines; and
a high mobility oxide semiconductor layer disposed between the high bandgap oxide semiconductor layers, wherein lateral lengths of the high bandgap oxide semiconductor layers are same with that of the high mobility oxide semiconductor layer.

13. The semiconductor memory device of claim 12, wherein
the high bandgap oxide semiconductor layers have a greater bandgap than the high mobility oxide semiconductor layer, and the high mobility oxide semiconductor layer has a greater mobility than the high bandgap oxide semiconductor layers.

14. The semiconductor memory device of claim 12, wherein both the high bandgap oxide semiconductor layers and the high mobility oxide semiconductor layer include GaO, InGaO, InSeO, InMgO, InGaZnO, or InAgO, the high bandgap oxide semiconductor layers have a greater bandgap than the high mobility oxide semiconductor layer, and the high mobility oxide semiconductor layer has a greater mobility than the high bandgap oxide semiconductor layers.

15. The semiconductor memory device of claim 12, wherein both the high bandgap oxide semiconductor layers and the high mobility oxide semiconductor layer include GaO, InGaO, InSeO, InMgO, InGaZnO, or InAgO, the high bandgap oxide semiconductor layers include a hydrogen diffusion inhibitor, and the high bandgap oxide semiconductor layers include a higher concentration of the hydrogen diffusion inhibitor than the high mobility oxide semiconductor layer.

16. The semiconductor memory device of claim 15, wherein the hydrogen diffusion inhibitor includes Hf, Si, W, Ti, Sc, Zr, Al, Nb, Ta, Mo, or a combination thereof.

17. The semiconductor memory device of claim 12, wherein one of the capacitors includes a planar-shape storage node, a cylinder-shape storage node, or a pillar-shape storage node.

18. A semiconductor memory device, comprising:

a substrate; and a three-dimensional array of memory cells over the substrate, wherein individual memory cells in the three-dimensional array include a transistor and a capacitor, wherein a channel of the transistor includes an inner oxide semiconductor layer disposed between two outer oxide semiconductor layers, wherein lateral lengths of the two outer oxide semiconductor layers are same with that of the inner oxide semiconductor layer.

19. The semiconductor memory device of claim 18, wherein the two outer oxide semiconductor layers have a greater bandgap than the inner oxide semiconductor layer, and the inner oxide semiconductor layer has a greater mobility than the two outer oxide semiconductor layers.

20. The semiconductor memory device of claim 18, wherein the inner oxide semiconductor layer includes InGaZnO, the outer oxide semiconductor layers include InGaZnO containing a hydrogen diffusion inhibitor, and the hydrogen diffusion inhibitor includes Hf, Si, W, Ti, Sc, Zr, Al, Nb, Ta, or Mo.

\* \* \* \* \*